(12) United States Patent
Long et al.

(10) Patent No.: US 9,761,731 B2
(45) Date of Patent: Sep. 12, 2017

(54) THIN FILM TRANSISTOR AND ITS MANUFACTURING METHOD, ARRAY SUBSTRATE AND ITS MANUFACTURING METHOD, AND DISPLAY DEVICE

(71) Applicant: BOE TECHNOLOGY GROUP CO., LTD., Beijing (CN)

(72) Inventors: Chunping Long, Beijing (CN); Yinan Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/764,307

(22) PCT Filed: Dec. 17, 2014

(86) PCT No.: PCT/CN2014/094114
§ 371 (c)(1),
(2) Date: Jul. 29, 2015

(87) PCT Pub. No.: WO2016/026246
PCT Pub. Date: Feb. 25, 2016

(65) Prior Publication Data
US 2016/0293771 A1    Oct. 6, 2016

(30) Foreign Application Priority Data

Aug. 19, 2014   (CN) .......................... 2014 1 0409198

(51) Int. Cl.
*H01L 27/14*     (2006.01)
*H01L 29/786*    (2006.01)
(Continued)

(52) U.S. Cl.
CPC .... *H01L 29/78675* (2013.01); *H01L 21/0273* (2013.01); *H01L 21/02532* (2013.01);
(Continued)

(58) Field of Classification Search
CPC ......... H01L 29/78675; H01L 29/66757; H01L 29/4958; H01L 29/4908; H01L 29/458; H01L 29/41733; H01L 29/786
See application file for complete search history.

(56) References Cited

U.S. PATENT DOCUMENTS

2009/0050894 A1*  2/2009  Park ..................... H01L 29/458
                                                          257/72
2010/0140706 A1   6/2010  Koo et al.
(Continued)

FOREIGN PATENT DOCUMENTS

CN    101241937 A    8/2008
CN    102280488 A    12/2011
(Continued)

OTHER PUBLICATIONS

International Search Report mailed May 26, 2015; PCT/CN2014/094114.
(Continued)

*Primary Examiner* — Dale E Page
*Assistant Examiner* — Wasiul Haider
(74) *Attorney, Agent, or Firm* — Ladas & Parry LLP

(57) ABSTRACT

A thin film transistor and its manufacturing method, an array substrate and its manufacturing method, and a display device are provided. The thin film transistor includes a gate electrode, a source electrode, a drain electrode, an active layer and a gate insulation layer. The gate insulation layer is provided above the active layer, the gate, the source electrode and the drain electrode are provided on a same layer above the gate insulation layer, the active layer and the source electrode are connected through a first connection electrode, and the active layer and the drain electrode are connected through a second connection electrode. The thin film transistor can be formed by three times of patterning processes, by which the process time period is shortened, the
(Continued)

process yield is improved, and the process cost is reduced, and so on.

23 Claims, 6 Drawing Sheets

(51) Int. Cl.

| | | |
|---|---|---|
| H01L 27/12 | (2006.01) | |
| H01L 21/02 | (2006.01) | |
| H01L 21/027 | (2006.01) | |
| H01L 21/265 | (2006.01) | |
| H01L 21/283 | (2006.01) | |
| H01L 21/3065 | (2006.01) | |
| H01L 23/31 | (2006.01) | |
| H01L 29/417 | (2006.01) | |
| H01L 29/45 | (2006.01) | |
| H01L 29/49 | (2006.01) | |
| H01L 29/66 | (2006.01) | |
| H01L 21/3213 | (2006.01) | |
| H01L 27/32 | (2006.01) | |

(52) U.S. Cl.
CPC .. *H01L 21/02595* (2013.01); *H01L 21/26513* (2013.01); *H01L 21/283* (2013.01); *H01L 21/3065* (2013.01); *H01L 21/32139* (2013.01); *H01L 23/3171* (2013.01); *H01L 27/12* (2013.01); *H01L 27/124* (2013.01); *H01L 27/1222* (2013.01); *H01L 27/1288* (2013.01); *H01L 29/41733* (2013.01); *H01L 29/458* (2013.01); *H01L 29/4908* (2013.01); *H01L 29/4958* (2013.01); *H01L 29/66757* (2013.01); *H01L 29/786* (2013.01); *H01L 27/3262* (2013.01); *H01L 27/3276* (2013.01); *H01L 2227/323* (2013.01)

(56) References Cited

U.S. PATENT DOCUMENTS

| | | | | |
|---|---|---|---|---|
| 2011/0057186 A1* | 3/2011 | Yamazaki | ........... | H01L 27/1225 257/43 |
| 2011/0096021 A1* | 4/2011 | Kim | .................... | G02F 1/13338 345/174 |
| 2011/0303923 A1 | 12/2011 | Noh et al. | | |
| 2013/0140574 A1* | 6/2013 | Liu | ..................... | H01L 27/1288 257/59 |
| 2013/0248850 A1* | 9/2013 | Choi | ................. | H01L 29/66969 257/43 |
| 2014/0117371 A1* | 5/2014 | Ma | ........................ | H01L 27/124 257/72 |
| 2014/0131682 A1* | 5/2014 | Kim | .................... | H01L 51/5253 257/40 |
| 2014/0131715 A1* | 5/2014 | Liu | ..................... | H01L 27/1218 257/59 |
| 2015/0214373 A1 | 7/2015 | Zhang et al. | | |

FOREIGN PATENT DOCUMENTS

| | | |
|---|---|---|
| CN | 103219391 A | 7/2013 |
| CN | 104022077 A | 9/2014 |

OTHER PUBLICATIONS

Written Opinion of the International Searching Authority mailed May 26, 2015, PCT/CN2014/094114.
First Chinese Office Action dated Aug. 5, 2016; Appln. No. 201410409198.9.

\* cited by examiner

THIN FILM TRANSISTOR AND ITS MANUFACTURING METHOD, ARRAY SUBSTRATE AND ITS MANUFACTURING METHOD, AND DISPLAY DEVICE

TECHNICAL FIELD

Embodiments of the present invention relate to a thin film transistor (TFT) and its manufacturing method, an array substrate and its manufacturing method, and a display device.

BACKGROUND

Compared with a liquid crystal display (LCD), an organic light emission display (OLED) has the advantages such as quick response, light weight, flexibility, wide view angle, and so on. An active matrix OLED (AMOLED) is further advantageous by a low driving current and low power consumption, and is suitable for high resolution displaying.

For an LCD display device or an OLED display device, thin film transistors (TFT) are provided as control switches. The thin film transistors may comprise amorphous silicon TFT, poly-silicon TFT, oxide semiconductor TFT or organic TFT for driving. An amorphous silicon or organic TFT has low carrier mobility and low driving current, while the voltage required for driving a high brightness OLED is high and the devices occupy large space. A low temperature poly-silicon TFT has mobility up to 100 cm$^2$/V·s, and its high current characteristic meets the strict requirements of an OLED; a low operation voltage and a high density driving structure can make the OLED having a long service life. Meanwhile, for the compensation circuit for improving grey scale and panel uniformity, in a same one pixel of the display device, a plurality of TFTs often are needed. With the high density layout characteristics of low temperature poly-silicon TFTs, the OLED panel with high brightness and high picture quality can be more easily achieved. Currently, almost all the AMOLEDs successfully put into the market employs the array substrate using low temperature poly-silicon TFT.

SUMMARY

The problems to be solved by the embodiments of the present invention are directed to the above shortcomings in the related technical field and provide a thin film transistor and its manufacturing method, an array substrate and its manufacturing method, and a display device. The thin film transistor and the array substrate comprising the thin film transistor can be formed by employing three times of patterning processes, by which the process time period is largely shortened, the process yield rate is improved, and the process cost is reduced.

At least one embodiment of the present invention provides a thin film transistor which comprises a gate electrode, a source electrode, a drain electrode, an active layer and a gate insulation layer, wherein the gate insulation layer is provided above the active layer, the gate electrode, the source electrode and the drain electrode are provided in the same layer above the gate insulation layer, the active layer is connected with the source electrode through a first connection electrode, and the active layer is connected with the drain electrode through a second connection electrode.

For example, a projection of the gate electrode is at least partly overlapped with a projection of the active layer, and a width of the gate electrode is less than a width of the active layer, and the source electrode and the drain electrode are respectively provided on both sides of the gate electrode and are respectively separated from the gate electrode; in an area in which the active layer is provided, a width of the gate insulation layer is less than a width of the active layer, so that a source contact area is formed in an area of the active layer adjacent to the source electrode, and a drain contact area is formed in an area of the active layer adjacent to the drain electrode, the first connection electrode is tapped with the source electrode and the source contact area to connect the source electrode with the active layer, the second connection electrode is tapped with the drain electrode and the drain contact area to contact the drain electrode with the active layer.

For example, the gate electrode, the source electrode and the drain electrode are formed of a same material, the gate electrode, the source electrode and the drain electrode are in a single layer structure formed by any one of molybdenum, molybdenum niobium alloy, aluminum, aluminum neodymium alloy, titanium of copper; or in a stack structure obtained from sub-layers of Mo/Al/Mo or Ti/Al/Ti; the gate electrode, the source electrode and the drain electrode have a thickness ranging from 200 to 500 nm.

For example, the active layer is formed of a low temperature poly-silicon material.

For example, the active layer and the poly-silicon film below the source electrode and the drain electrode is filled with an gate insulation film; and the first connection electrode and the second connection electrode are provided on a same layer and are formed of same material.

At least one embodiment of the present invention provides an array substrate comprising one of the above thin film transistors.

For example, the array substrate further comprises a passivation layer and a pixel electrode, the passivation layer is partly provided above the drain electrode and forms a mate drain contact area at a side of the drain electrode adjacent to the gate electrode, and the pixel electrode is connected with the drain electrode by tapping with the mate drain contact area and the drain contact area.

For example, the array substrate further comprises a gate line and a data line that are intersected with each other, the gate line is connected with the gate electrode and provided on a same layer as the gate electrode, the data line is connected with the source electrode and is provided on a same layer as the source electrode, and the gate line or the data line is disconnected at the intersection position and is connected through a line connection electrode.

For example, the pixel electrode, the first connection electrode, the second connection electrode and the line connection electrode are provided on a same layer, and are formed from a same material.

For example, the pixel electrode, the first connection electrode, the second connection electrode and the line connection electrode are formed from any one of indium gallium zinc oxide, indium zinc oxide, indium tin oxide, or indium gallium tin oxide.

At least one embodiment of the present invention provides a display device comprising any of the above array substrates.

At least one embodiment of the present invention provides a manufacturing method of a thin film transistor comprising steps of forming a gate electrode, a source electrode, a drain electrode, an active layer and a gate insulation layer, wherein the gate insulation layer is formed above the active layer; the gate electrode, the source electrode and the drain electrode are formed on a same layer above the gate insulation layer; the gate electrode, the source electrode and the drain electrode are formed by same one patterning process as the active layer; and a first connection electrode is formed for connecting the active layer with the source electrode, and a second connection electrode is formed for connecting the active layer with the drain electrode.

For example, the step of forming the gate electrode, the source electrode, the drain electrode and the active layer comprises:

step S1): sequentially continuously forming a poly-silicon film, a gate insulation film, a metal film and photoresist;

step S2): by using a double-tone mask process, performing exposure and development to the photoresist, wherein in the mask used in the double-tone mask process, an area corresponding to forming of the gate electrode, the source electrode and the drain electrode is a light shielded area, an area corresponding to forming of the active layer having a width larger than the gate electrode is a light partially transmitting area, and a remaining area is a light fully transmitting area; after exposure and development, a thickness of the photoresist corresponding to the area for forming the gate electrode, the source electrode and the drain electrode is larger than a thickness of the photoresist corresponding to the area for forming the active layer having a width larger than the gate electrode, the photoresist in the remaining area is fully removed;

step S3): by an etching process, the metal film unprotected by the photoresist is removed to form a pattern comprising the source electrode and the drain electrode;

step S4): continuously etching the gate insulation film and the poly-silicon film to form a pattern comprising the active layer;

step S5): by an ashing process, removing the photoresist with the smaller thickness to expose the metal film in the area having the width larger than the gate electrode;

step S6): by an etching process, removing the metal film in the area of the active layer having the larger width than the gate electrode, to form a pattern comprising the gate electrode;

step S7): removing all the residual photoresist;

Step S8): using the gate electrode as a barrier layer, ion-doping the pattern for the active layer, and activating ions doped in a channel and source/drain area, to form the active layer.

For example, in the step S8), the gate electrode is used as the barrier layer, the pattern for the active layer is ion-doped by an ion implantation or ion showering method, and the channel doping and source/drain doping ions are activated by rapid heat annealing process, to form the active layer, and the ion to be doped is from $PH_3/H_2$ or $B_2H_6/H_2$, and the ion implantation dosage is between $10^{15}$-$10^{16}$ ions/cm$^2$, and the implantation energy is between 10-100 Kev.

For example, in the step S1), the metal film is in a single layer structure formed by any one of molybdenum, molybdenum niobium alloy, aluminum, aluminum neodymium alloy, titanium or copper, or in a stack structure obtained from sub-layers of Mo/Al/Mo or Ti/Al/Ti, the metal film is formed by magnetic sputtering, and a thickness of the metal film ranges from 200 to 500 nm; correspondingly in the step S6), when the metal film is a stacked structure obtained from sub-layers of Mo/Al/Mo, by using a wet etching method, the metal film in the area of the active layer having a larger width than the gate electrode is removed; when the metal film is a stacked structure obtained from sub-layers of Ti/Al/Ti, by using a dry etching method, the metal film in the area of the active layer having a larger width than the gate electrode is removed.

For example, the method further comprises a step of filling the area between the active layer and the poly-silicon film below the source electrode and the drain electrode with a insulation film; and forming a first connection electrode for connecting the source contact area with the source electrode and a second connection electrode for connecting the drain contact area with the drain electrode by one patterning process.

At least one embodiment of the present invention provides a manufacturing method of an array substrate comprising any one of the above manufacturing methods of a thin film transistor.

For example, the method further comprises a step of forming a gate line and a data line that are intersected with each other, wherein the gate line is connected with the gate electrode, the data line is connected with the source electrode, the gate electrode, the source electrode, the drain electrode, the data line and the gate line are provided on a same layer and are formed through same one patterning process, the gate line or the data line is disconnected at the intersection position and is connected by a line connection electrode.

For example, the method further comprises a step of forming a passivation layer and a pixel electrode, wherein the passivation layer and the pixel electrode are formed by one patterning process; the pixel electrode and the line connection electrode for connecting the gate line or the data line are formed above the passivation layer, the pixel electrode, the first connection electrode, the second connection electrode and the line connection electrode are simultaneously formed by one patterning process—photoresist lifting-off process.

For example, the step of forming the passivation layer and the pixel electrode comprises:

step S1): sequentially forming a passivation film and photoresist above the array substrate;

step S2): by using a double-tone mask process, performing exposure and development to the photoresist, wherein in the mask used in the double-tone mask process, an area corresponding to the gate electrode and the gate line connected therewith, the source electrode and the data line connected therewith, the active layer and an area of the drain electrode away from the gate electrode is a light shielded area; an area corresponding to forming the pixel electrode and the line connection electrode for connecting the gate line or the data line is a light partially transmitting area, and a remaining area is a light fully transmitting area;

step S3): etching the passivation film up to a depth at which the metal film of the source electrode adjacent to the gate electrode, and the metal film of the drain electrode adjacent to the gate electrode are exposed, to form a mate source contact area and a mate drain contact area, and up to a depth at which the poly-silicon film on both sides of the active layer having a larger width than the gate electrode being exposed, to form a source contact area and a drain contact area;

step S4): by an ashing process, removing the photoresist in the light partially transmitting area, and remaining the photoresist in the light shielded area;

step S5): forming a conductive film above the array substrate obtained in the step S4);

step S6): with a photoresist lifting-off process, removing the photoresist and the conductive film on the photoresist, to form the pixel electrode and the line connection electrode for connecting the gate line or the data line, to simultaneously form the patterns for the first connection electrode for connecting the source contact area with the mate source contact area and the second connection electrode for connection the drain contact area with the mate drain contact area.

For example, in the step S3), the etching of the passivation film is performed by an inductively coupled plasma method having high selection ratio and good anisotropy, and the etching of the light fully transmitting area is achieved by using $SF_6/O_2/He$ gas.

For example, in the step S5), the conductive film is a transparent metal oxide conductive film and the metal oxide comprises any one of indium tin oxide, indium zinc oxide and tin aluminum oxide, and having a thickness ranging from 20 to 100 nm, alternatively, the conductive film is a stacked film obtained from sub-layers of indium tin oxide/silver/indium tin oxide or indium zinc oxide/silver, a thickness of the indium tin oxide ranges from 10 to 50 nm, and a thickness of the silver film ranges from 20 to 100 nm.

For example, the method further comprises a step of performing a rapid heat annealing or heat treatment furnace annealing process to the array substrate.

DESCRIPTION OF ACCOMPANYING DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

1. substrate; 2. buffer layer; 4. active layer; 4a. poly-silicon film; 4b. source contact area; 4c. drain contact area; 5. Metal film; 5a. photoresist with a larger thickness; 5b. photoresist with a smaller thickness; 6. gate insulation layer; 6a. gate insulation film; 7. gate electrode; 7a. gate line; 8. Interlayer insulation layer; 9. source electrode; 9b. data line; 9c. mate source contact area; 10. drain electrode; 10b. mate drain contact area; 11. passivation layer; 11a. passivation film; 12. pixel electrode; 12a. conductive film; 12b. first connection electrode; 12c. second connection electrode; 12d. line connection electrode; 13. pixel defining layer; 14. insulation film.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In order to more easily understand the technical solution of the present invention by the person skilled in the art, hereinafter, a thin film transistor and its manufacturing method, an array substrate and its manufacturing method, and a display device according to the present invention will be described in connection with the attached drawings and specific embodiments.

Figure 1:
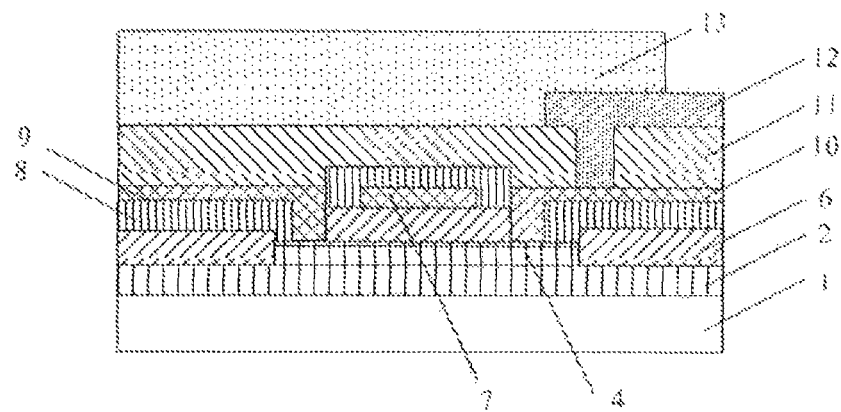
FIG. 1 is a schematic structural view of an array substrate comprising a low temperature poly-silicon thin film transistors.

FIG. 1 is a schematic structural view of an array substrate comprising a low temperature poly-silicon TFT, the array substrate comprises a layer structure comprising an active layer 4, a gate electrode 7, an interlayer insulation layer 9, a source electrode 9/drain electrode 10, a passivation layer 11, a pixel electrode 12, a pixel defining layer 13, and so on. The manufacturing process of the array substrate generally comprises a plurality of patterning processes, and one patterning process corresponds to one mask (also referred to as photomask). The manufacturing method of the array substrate generally comprises the following steps.

A buffer layer 2 is formed above a substrate; then an amorphous silicon (a-Si) film is formed above the buffer layer and the a-Si silicon is transformed to poly-silicon; after that, by a first patterning process (usually, an ordinary mask), a pattern comprising the active layer 4 is formed. Ion implantation process is employed to perform low concentration ion doping to form a semiconductor channel required by the active layer 4 of the thin film transistor.

A gate insulation layer 6 is formed above the active layer 4 and the entire buffer layer 2; photoresist is coated, a photoresist pattern is formed for forming a storage capacitor with an amorphous silicon film doped in a second patterning process, the photoresist pattern is used as a barrier layer for ion implantation, and the photoresist pattern is removed after doping is completed.

One or more low resistance metal materials are deposited on the gate insulation layer 6 to form a gate metal film, and forming a pattern comprising the gate electrode 7 by a third patterning process. The gate electrode 7 is used as a barrier layer for ion implantation to perform ion doping to the active layer 4 so as to form a source contact area and a drain contact area with low resistance.

A first dielectric film is formed on the entire surface comprising the gate electrode 7, and an interlayer insulation 8 and a source contact hole and a drain contact hole in the interlayer insulation layer 8 are formed by a fourth patterning process.

One or more low resistance metal materials are formed to form a source/drain metal film, and a pattern comprising the source electrode 9 and the drain electrode 10 is formed by a fifth patterning process, and ohmic contact with the active layer 4 is formed through the source contact hole and the drain contact hole. The ions implanted into the active layer 4 are activated by rapid thermal annealing or heat treatment furnace annealing, to form an effective conductive channel.

A second dielectric film is formed on the entire surface comprising the source electrode 9 and the drain electrode 10, and by a sixth patterning process, the passivation layer 11 comprising a passivation layer via hole is formed. A hydrogenating process is performed by rapid thermal annealing or heat treatment furnace annealing to repair defects in the active layer 4 and at the interface. In this step, in the same one patterning process, an organic flattening layer having the same via hole can be further formed above the passivation layer 11 to provide a flat surface.

A layer of transparent conductive film is formed above the array substrate on which the above steps have been completed, and by a seventh patterning process, the pixel electrode 12 is formed; when the array substrate is applied in an AMOLED, the pixel defining layer 13 as shown in FIG. 1 can be formed by a eighth patterning process.

In summary, at least seven patterning processes are needed to form the array substrate comprising the low temperature poly-silicon film transistors as shown in FIG. 1, which results in a relative long process time period and low process yield, so that the process cost of the array substrate is relative high.

First Embodiment

The present embodiment of the present invention provides a thin film transistor and the corresponding manufacturing method for the thin film transistor.

Figure 2A:
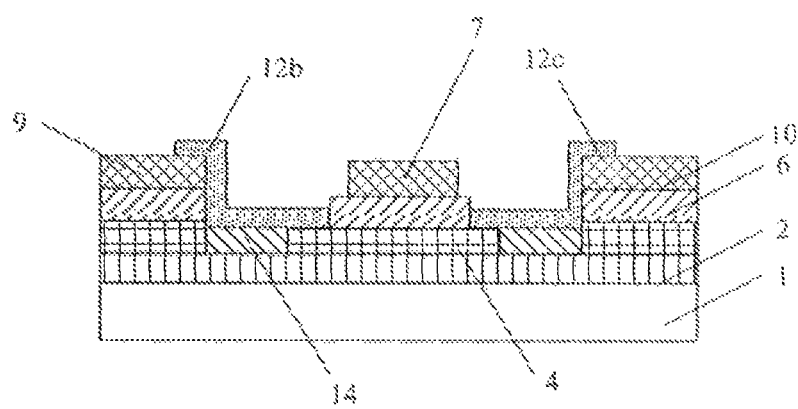
FIG. 2A, FIG. 2B are schematic structural views of the low temperature poly-silicon thin film transistor in a first embodiment of the present invention.
Figure 2B:
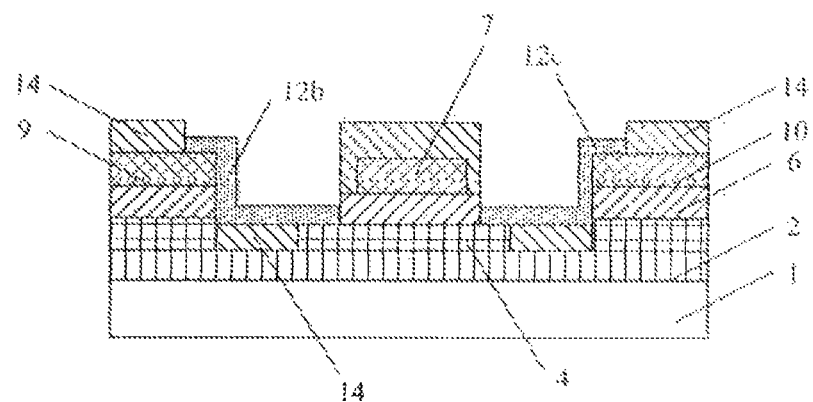

As shown in FIG. 2A and FIG. 2B, the thin film transistor comprises a gate electrode 7, a source electrode 9, a drain electrode 10, an active layer 4 and a gate insulation layer 6. The gate insulation layer 6 is provided above the active layer 4, the gate electrode 7, the source electrode 9 and the drain electrode 10 are provided on a same layer above the gate insulation layer 6, the active layer 4 is connected to the source electrode 9 through a first connection electrode 12b, and the active layer 4 is connected with the drain electrode 10 through a second connection electrode 12c.

It is to be appreciated that in the present disclosure, the term "on a same layer" means a layer structure which is obtained by firstly forming a film layer for forming a specific pattern by the same one filming process and then by one patterning process by using the same one mask. According to the specific pattern, the one patterning process may comprise exposure processes, a development process or an etching process, and the specific pattern in the layer structure may be continuous or non-continuous, and these specific patterns may also be located at different height or have different thickness.

As shown in FIG. 2A and FIG. 2B, the projections of the gate electrode 7 and the active layer 4 are at least partly overlapped with each other, and the width of the gate electrode 7 is less than the width of the active layer 4, that is, in the area corresponding to the active layer 4, the orthogonal projection of the gate electrode 7 on the active layer 4 falls entirely within the active layer 4, and the active layer 4 further comprises edge areas on both sides which are not covered by the gate electrode, and the edge areas accordingly form the source contact area and the drain contact area. The source electrode 9 and the drain electrode 10 are respectively provided on both sides of the gate electrode 7 and are respectively spaced from the gate electrode 7 (having a spacing therebetween). In the area in which the active layer 4 is provided, the width of the gate insulation layer 6 is less than the width of the active layer 4, that is, corresponding to the area in which the active layer 4 is formed, the gate insulation layer 6 partly covers the active layer 4 from above, so that in the area of the active layer 4 adjacent to the source electrode 9, the source contact area 4b is formed, and in the area of the active layer 4 adjacent to the drain electrode 10, the drain contact area 4c is formed, which can be seen in FIG. 5C, the source contact area 4b and the drain contact area 4c are not specifically shown in FIG. 2A and FIG. 2B because they are respectively covered by the first connection electrode 12b and the second connection electrode 12c. The first connection electrode 12b taps with both the source electrode 9 and the source contact area 4b in connection so that the source electrode 9 is electrically connected with the active layer 4, and the second connection electrode 12c taps with both the drain electrode 10 and the drain contact area 4c in connection so that the drain electrode 10 is electrically connected with the active layer 4.

The gate electrode 7, the source electrode 9 and the drain electrode 10 are formed of a same material, the gate electrode 7, the source electrode 9 and the drain electrode 10 may be in a single layer structure form by any one selected from molybdenum (Mo), molybdenum niobium alloy, aluminum (Al), aluminum neodymium alloy (AlNd), titanium (Ti) or Copper (Cu), or in a stack structure obtained from sub-layers of Mo/Al/Mo or Ti/Al/Ti, the thickness of the gate electrode 7, the source electrode 9 and the drain electrode 10 ranges from 200 nm to 500 nm.

Furthermore, for example, the active layer 4 is formed of a low temperature poly-silicon material so that the thin film transistor may have excellent electrical performance.

For example, the area between the active layer 4 and the poly-silicon film 4a corresponding to the lower side of both the source electrode 9 and the drain electrode 10 is filled with a insulation film 14 so as to form the partition/spacer between the gate electrode 7 and both the source electrode 9 and the drain electrode 10 as well as the partition/spacer between the active layer 4 and the poly-silicon film 4a; and the first connection electrode 12b and the second connection electrode 12c are provided on a same layer and formed by using a same material.

Accordingly, the present embodiment further provides a manufacturing method for the thin film transistor, and the manufacturing method comprises steps of: forming the gate electrode, the source electrode 9, the drain electrode 10, the active layer 4 and the gate insulation layer 6, wherein the gate electrode 7, the source electrode 9 and the drain electrode 10 are formed on a same layer above the gate insulation layer 6, the gate electrode 7, the source electrode 9 and the drain electrode 10 are formed by using the same patterning process as the active layer 4; and forming the first connection electrode 12b for connecting the active layer 4 with the source electrode 9 and the second connection electrode 12c for connecting the active layer 4 with the drain electrode 10.

Before description of the specific manufacturing method, it is to be appreciated that in the embodiments of the present invention, the patterning process may only comprise a photolithography process, or comprises a photolithography process and an etching process, and at the same time, may also comprise printing, ink-jetting, or the other process for forming a predetermined pattern. The photolithography process means the process for forming a pattern by using photoresist, mask, exposure machine, and so on, comprising the procedures of forming of film, exposing, developing, and so on. The patterning process can be appropriately selected according to the structure formed in the embodiment of the present invention.

Hereinafter, by using the low temperature poly-silicon thin film transistor as shown in FIG. 2A and FIG. 2B as an example, the manufacturing method for the thin film transistor according to the present embodiment will be described with reference to FIG. 3A to FIG. 3F.

For example, the step of forming the gate electrode 7, the source electrode 9 and the drain electrode 10, as well as the active layer 4 may comprise the following steps:

Step S1): sequentially forming a poly-silicon film, a gate insulation film, a metal film and photoresist.

In this step, firstly, the substrate 1 is initially cleaned to clear impurity particles on the surface of the substrate. Then, a layer of silicon nitride (SiNx) film and silicon dioxide (SiO$_2$) film as the buffer layer 2 is deposited on the surface of the substrate 1 by plasma enhanced chemical vapor deposition (PECVD) method, referring to FIG. 3A. The SiNx film used for the buffer layer 2 has a thickness ranging from 50 to 100 nm, and the SiO$_2$ film has a thickness ranging from 100 to 400 nm.

Figure 3A:
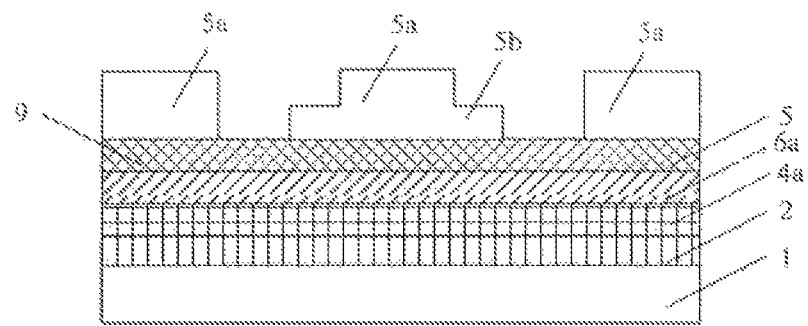
FIG. 3A is a schematic structural view of the thin film transistor comprising photoresist in different thicknesses formed by a first patterning process.

Next, a layer of amorphous silicon (a-Si) film with a thickness ranging from 40 to 100 nm is continuously deposited by using PECVD, and the a-Si film is subjected to a dehydrogenization process with a heat treatment furnace to prevent hydrogen explosion during crystallization. Then, the crystallization process for the a-Si film is performed by using a laser annealing crystallization method, a metal induced crystallization method, a solid state crystallization method, or the like, to form a poly-silicon film 4a as shown in FIG. 3A.

The SiNx film for forming the buffer layer 2 has a very strong diffusion barrier property, and can suppress alkali metal ions and Na, K ions in the substrate (usually, glass) from influencing the poly-silicon film 4a. The SiO$_2$ film and the poly-silicon film 4a have a good interface and can prevent defects in the SiNx film from impairing the quality of the poly-silicon film 4a.

Then, the poly-silicon film 4a is washed by using diluted hydrofluoric acid to reduce the surface roughness of the poly-silicon film 4a so as to reduce defects at the interface of the thin film transistor. With an ion implantation or ion showering method, the poly-silicon film 4a is subjected to thin film transistor channel doping, the ions are doped generally with PH$_3$/H$_2$ or B$_2$H$_6$/H$_2$, and the ion implantation dosage is between $10^{11}$-$13^{16}$ ions/cm$^2$, and the implantation energy is between 10 to 100 KeV. By means of channel doping, the threshold voltage of the thin film transistor can be effectively adjusted, and the switch characteristic of the thin film transistor can be improved.

A layer of gate insulation film 6a is deposited on the poly-silicon film 4a by a PECVD method, the gate insulation film 6a is generally a two-layer film comprising SiO$_2$ with a thickness ranging from 30 to 100 nm and SiNx with a thickness ranging from 20 to 100 nm, wherein the SiO$_2$ film is a base layer, and the SiNx film is a top layer.

Then, a layer of metal film 5 with a thickness of 200-500 nm is formed above the gate insulation film 6a by a magnetic sputtering method, the metal film 5 is of a single layer structure formed by any one selected from Molybdenum (Mo), molybdenum niobium alloy, aluminum (Al), aluminum neodymium alloy (AlNd), titanium (Ti) and Copper (Cu), or is of stacked structure obtained by forming sub-lays from Mo/Al/Mo or Ti/Al/Ti.

Step S2): performing exposure and development with respect to photoresist by using double-tone mask process. In the mask used in the double-tone mask process, there is a light shielding area corresponding the area in which the gate electrode 7, the source electrode 9 and the drain electrode 10 are formed, a light partially transmitting area corresponding to the area in which the width of the active layer 4 larger than the gate electrode is formed, and light fully transmitting area corresponding to the remaining area. After exposure and development process, the thickness of photoresist (i.e., the photoresist with a larger thickness 5a) in the area corresponding to the area, in which the gate electrode 7, the source electrode 9 and the drain electrode 10 are formed, is formed so as to be larger than the thickness of photoresist (i.e., the photoresist with a smaller thickness 5b) in the area in which the active layer 4 having a larger width than the gate electrode 7 is formed, and photoresist in the remaining area is fully removed (in the array substrate, the photoresist corresponding to the gate line 7a and data line 9b needs to be remained).

As shown in FIG. 3A, in this step, by using one double-tone mask, the photoresist with two different thicknesses can be formed on the surface of the metal film 5, that is, the photoresist with a larger thickness 5a and the photoresist with a smaller thickness 5b. The double-tone mask can be a half-tone mask or a gray-tone mask, the photoresist with a larger thickness has a thickness ranging from 1 to 3 micron, and mainly corresponds to the pattern for forming the gate electrode 7, the source electrode 9 and the drain electrode 10. The photoresist with a smaller thickness 5b has a thickness ranging from 0.5 to 1 micron, and mainly corresponds to the pattern for forming the source contact area 4b for connecting the source electrode 9 and the active layer 4 and forming the drain contact area 4c for connecting the drain electrode 10 and the active layer 4.

Step S3): removing the metal film not protected by the photoresist by an etching process to form a pattern comprising the source electrode 9 and the drain electrode 10.

Figure 3B:
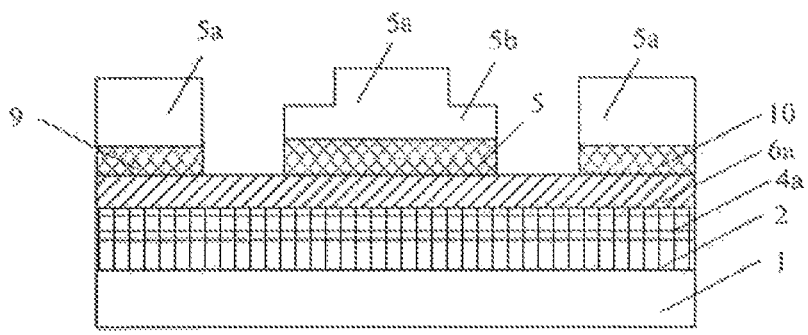
FIG. 3B is a schematic structural view of the thin film transistor after a pattern comprising a source electrode and a drain electrode has been formed.

In this step, the metal film not protected by the photoresist is removed by an etching process, to form the source electrode 9 (the array substrate further comprises the data line 9b connected therewith) and the drain electrode 10, as shown in FIG. 3B. According to the material for forming the metal film in the step S1), the etching process may be a wet etching method or a dry etching method. For example, the metal film having stacked structure obtained from sub-layers of Mo/Al/Mo is removed by a wet etching method, and the metal film having stacked structure obtained from sub-layers of Ti/Al/Ti is removed by a dry etching method, such as inductively coupled plasma method, and so on.

Step S4): continuously etching the gate insulation film 6a and the poly-silicon film 4a to form a pattern comprising the active layer 4.

Figure 3C:
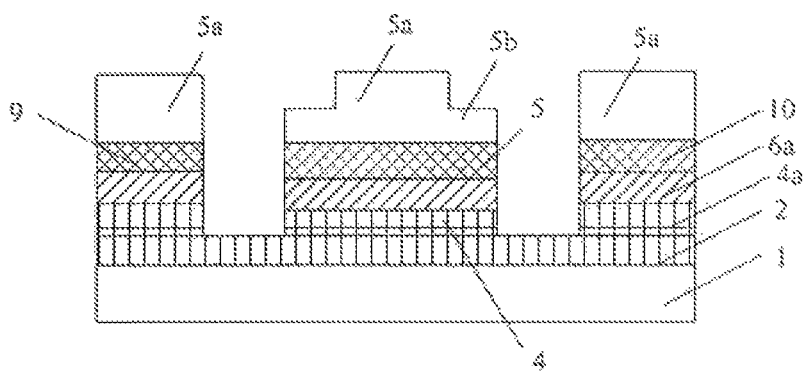
FIG. 3C is a schematic structural view of the thin film transistor after a pattern comprising an active layer has been formed.

As shown in FIG. 3C, in this step, the etching process of the gate insulation film 6a and the poly-silicon film 4a is continuously performed by plasma or inductively coupled plasma method, and the etching is performed up to the depth by which the poly-silicon film 4a not protected by the photoresist is fully removed, to prevent the performance of the thin film transistor from degrading due to the connection of the poly-silicon film 4a, and to form the pattern comprising the active layer 4.

Step S5): removing the photoresist with the smaller thickness by an ashing process to expose the metal film 5 in the area having a larger width than the gate electrode 7.

Figure 3D:
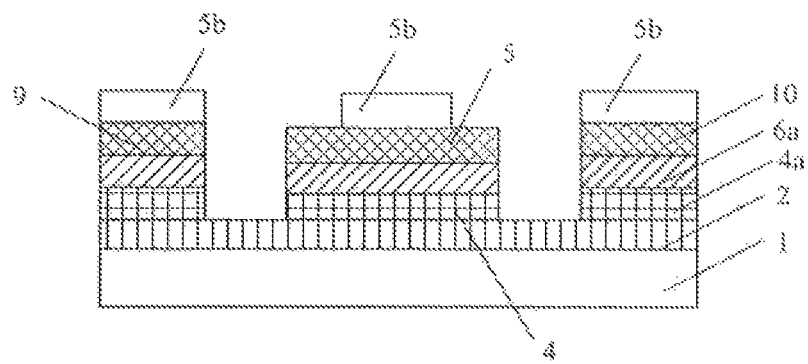
FIG. 3D is a schematic structural view of the thin film transistor after an ashing process has been employed.

As shown in FIG. 3D, in this step, in a dry etching apparatus, the photoresist portion with a smaller thickness 5b is removed by an ashing process to expose the metal film 5 corresponding to the source contact area 4b and the drain contact area 4c. The photoresist covering the source electrode 9 (the array substrate further comprises the data line 9b connected therewith), the drain electrode 10 and the gate electrode 7 (the array substrate further comprises the gate line 7a connected therewith), to expose the metal film 5 in edge portions on both sides of the gate electrode 7, for allowing to remove the metal film 5 in the exposed portion and the gate insulation film 6a therebelow in the subsequent process steps, so as to form contour of a pattern comprising the gate electrode 7, the source contact area 4b and the drain contact area 4c in the metal film 5, and to form contour of a pattern comprising the source contact area 4b and the drain contact area 4c in the gate insulation film 6a and the poly-silicon film 4a.

Step S6): removing the metal film 5 in the area of the active layer 4 having a larger width than the gate electrode by an etching process, to form a pattern comprising the gate electrode 7.

Figure 3E:
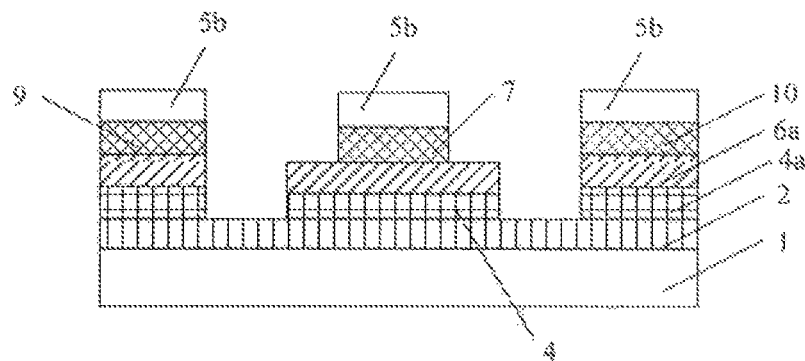
FIG. 3E is a schematic structural view of the thin film transistor after a pattern comprising a gate electrode has been formed.

As shown in FIG. 3E, in this step, the exposed metal film 5 and the gate insulation film 6a therebelow are removed by an etching process, that is, the metal film 5 corresponding to the area of the active layer 4 having a larger width than the gate electrode 7 (the pattern for the source contact area 4b and the drain contact area 4c) is removed, to remain the contour of the pattern for forming the source contact area 4b and the drain contact area 4c in the gate insulation film 6a and the poly-silicon film 4a.

Corresponding to the Step S1), when the metal film is a stacked structure obtained from sub-layers of Mo/Al/Mo, the metal film in the area of the active layer 4 having a larger width than the gate electrode 7 is removed by a wet etching method (that is, removing the edge portions on both sides of the gate electrode 7). When the metal film 5 is a stacked structure obtained from the sub-layers of Ti/Al/Ti, a dry etching method is employed, for example, by using the inductively coupled plasma method, the metal film 5 in the area of the active layer 4 having a larger width than the gate electrode 7 is removed (that is, removing the edge portions on both sides of the gate electrode 7), to form the gate electrode 7 (the array substrate further comprises the gate line 7a connected therewith).

Here, the Step S3) and Step S6) are both performing etching with respect to the same one metal film 5 and may employ a same etching method. The wet etching method is advantageous in that a side face having a gentle sidewall and a small slope angle can be easily formed, and the dry etching method is advantageous in that a pattern having a small critical size and a precisely controlled size can be easily formed.

Step S7): removing all the residual photoresist.

Figure 3F:
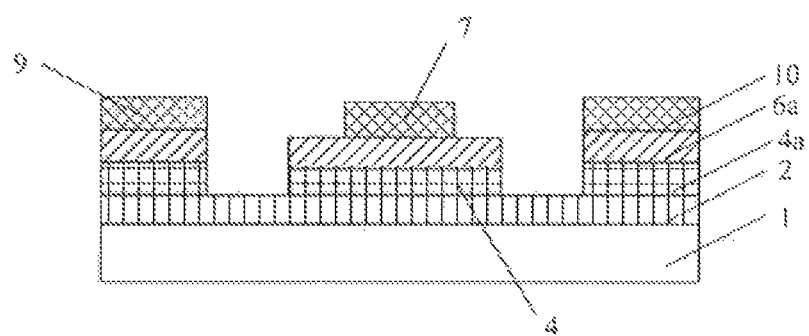
FIG. 3F is a schematic structural view of the thin film transistor after photoresist has been removed.

In this step, the residual photoresist are fully removed by a stripping machine, to form a pattern as shown in FIG. 3F.

Step S8): using the gate electrode 7 as a barrier layer, ion-doping the pattern of the active layer, and activating ions doped in a channel and source/drain area, to form the active layer 4.

In this step, the gate electrode 7 is used as a source/drain doping barrier layer, and by an ion implantation or ion showering method, the pattern of the active layer 4 is subjected to ion doping. For example, the doped ions are obtained generally from $PH_3/H_2$ or $B_2H_6/H_2$, and the ion implantation dosage is between $10^{15}$-$10^{16}$ ions/cm$^2$, the implantation energy is between 10-100 KeV. Then, by a rapid thermal annealing process, ions doped into the channel and source/drain are activated to enhance the conductivity of the poly-silicon film.

Here, it is to be appreciated that the thin film transistor in the present embodiment has the poly-silicon film 4a corresponding to a middle portion of the photoresist with two different thicknesses only when the portion at least partly overlapped with the projection of the gate electrode 7 is the effective active layer 4 (Step S1), and has the poly-silicon film 4a corresponding to both side portions of the photoresist with a larger thickness, which portion is at least partly overlapped with the projections of the source electrode 9 and the drain electrode 10 and is remained as the poly-silicon film 4a (Step S1) where the ion doping is not performed.

In the above structure, for the normal switch function of the thin film transistor, as shown in FIG. 2A and FIG. 2B, the area between the active layer 4 and the poly-silicon film 4a corresponding to the lower side of the source electrode 9 and the drain electrode 10 is filled with an insulation film 14, so as to form partition between the gate and both the source electrode 9 and the drain electrode 10 as well as partition between the active layer 4 as well as the poly-silicon film 4a. Accordingly, when the above step S8) has been completed, the areas on both sides of the gate electrode 7 corresponding to the source contact area 4b and the drain contact area 4c are still covered by the gate insulation film 6a, in the patterning process for filling the insulation film 14 in the area between the active layer 4 and the poly-silicon film 4a corresponding to the lower side of the source electrode 9 and the drain electrode 10, the gate insulation film 6a in the areas corresponding to the source contact area 4b and the drain contact area 4c on both sides of the gate electrode 7 can be removed at the same time, so as to form patterns for the source contact area 4b and the drain contact area 4c, and to form a pattern for the gate insulation layer 6 at the same time.

Of course, as shown in FIG. 2B, based on the structure as shown in FIG. 2A, the insulation film 14 may further be formed above the source electrode 9 and the drain electrode 10 so as to protect the source electrode 9 and the drain electrode 10.

After the formation of the gate electrode 7, the source electrode 9 and the drain electrode 10, the manufacturing method further comprises forming the first connection electrode 12b for connecting the source contact area 4b with the source electrode 9 and the second connection electrode 12c for connecting the drain contact area 4c with the drain electrode 10 by one patterning process, so as to form the thin film transistor as shown in FIG. 2A or FIG. 2B.

In the thin film transistor according to the present embodiment, in order to reduce times of the photolithography in the manufacturing process, the following two technical methods are employed, that is: (1) double-tone mask photolithography process, and (2) the gate line (gate line 7a) and the source electrode 9 (data line 9b), the drain electrode 10 are deposited on a same layer so that the number of the patterning processes for the array substrate comprising the low temperature poly-silicon thin film transistors can be reduced to three times.

In brief, a poly-silicon film is formed on a substrate, and a gate insulation layer and a metal film are continuously deposited, by using double-tone mask process, to form photoresist with two different thicknesses, a pattern for a gate electrode 7, a source electrode 9 and a drain electrode 10 is formed by the relatively thicker photoresist, and a source contact area 4b and a drain contact area 4c of the poly-silicon film is formed by the relatively thinner photoresist; the source electrode 9 and the drain electrode 10 are formed at the same time by one patterning process; then by removing the relatively thinner photoresist, the metal film covering the source contact area 4b and the drain contact area 4c of the poly-silicon film is exposed, the exposed metal film is removed by an etching process to form the gate electrode 7 of the thin film transistor; and therefore the three patterning processes usually used to form the poly-silicon film (active layer 4), the gate electrode 7, and the source electrode 9, the drain electrode 10 is reduced to one.

In summary, in the thin film transistor according to the present embodiment, the gate electrode 7, the source electrode 9 and the drain electrode 10 are formed on a same layer from a same material and by using the same one patterning process, and the active layer 4 is connected respectively with the source electrode 9 and the drain electrode 10 by connection electrodes, to achieve the normal function of the thin film transistor, by which the times of the patterning processes for the low temperature poly-silicon thin film transistor is largely reduced, and thus the object of improving product yield and reducing processing cost is achieved.

Second Embodiment

The present embodiment provides an array substrate and a corresponding manufacturing method for the array substrate. The array substrate comprises the thin film transistors in the first embodiment.

Figure 4:
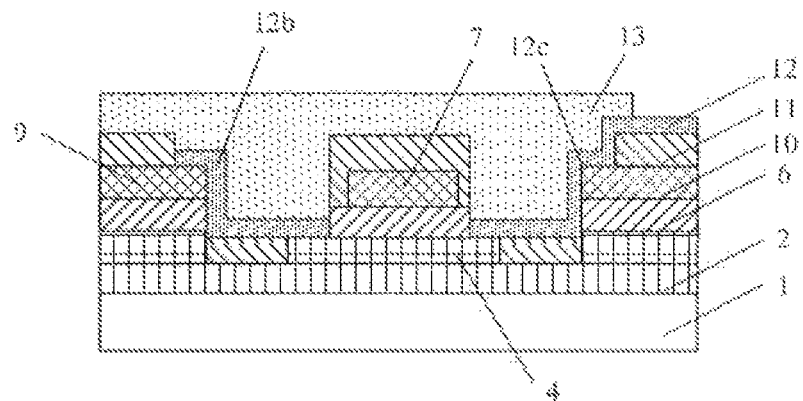
FIG. 4 is a schematic structural view of an array substrate comprising a low temperature poly-silicon thin film transistor in a second embodiment of the present invention.

As shown in FIG. 4, based on the thin film transistor shown in FIG. 3F in the first embodiment, the array substrate according to the present embodiment further comprises a passivation layer 11 and a pixel electrode 12; the passivation layer 11 is partially provided above the drain electrode 10 to form a mate drain contact area 10b at a side of the drain electrode 10 adjacent to the gate electrode 7; and the pixel electrode 12 is connected with the drain electrode 10 by tapping with the mate drain contact area 10b and the drain contact area 4c. Referring to FIG. 5c, the mate source contact area 9c and the source contact area 4b are not specifically shown in FIG. 4 because they are covered by the first connection electrode 12b, and also as well as the mate drain contact area 10b and the drain contact area 4c are not specifically because they are covered by the second connection electrode 12c.

Figure 5A:
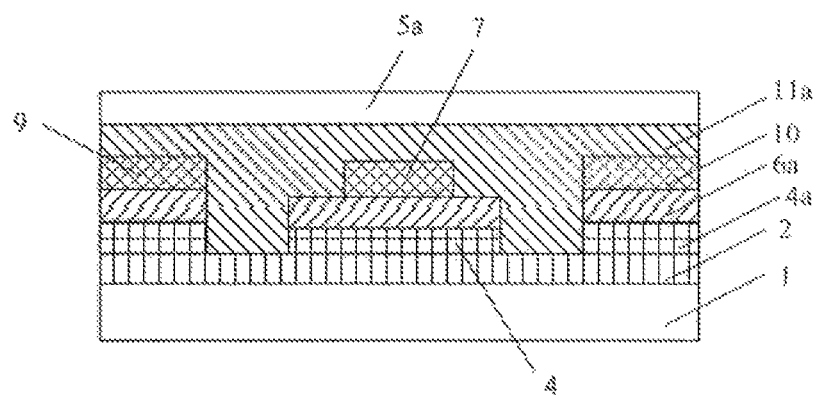
FIG. 5A is a schematic structural view of the array substrate on which a passivation film and photoresist have been formed.
Figure 5B:
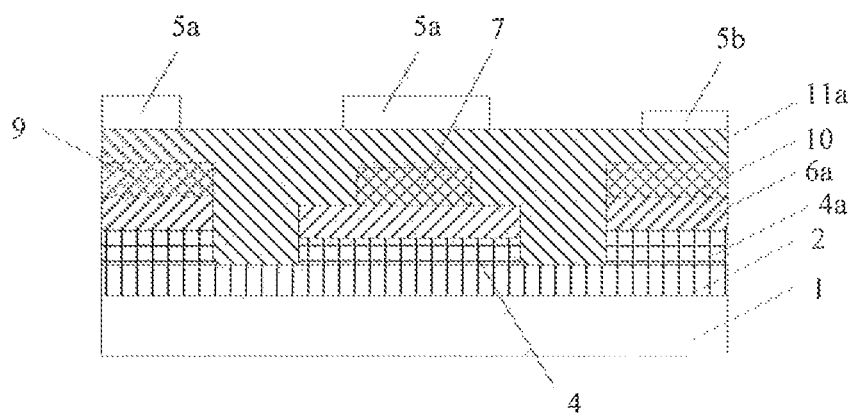
FIG. 5B is a schematic structural view of the array substrate comprising photoresist in different thicknesses formed by employing a second patterning process.
Figure 5C:
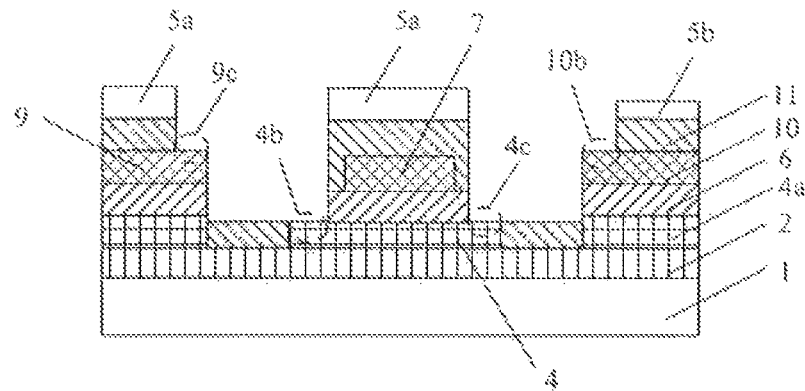
FIG. 5C is a schematic structural view of the array substrate on which a pattern comprising a passivation layer and a passivation layer via, a source contact area and a drain contact area, a mate source contact area and a mate drain contact area has been formed.
Figure 5D:
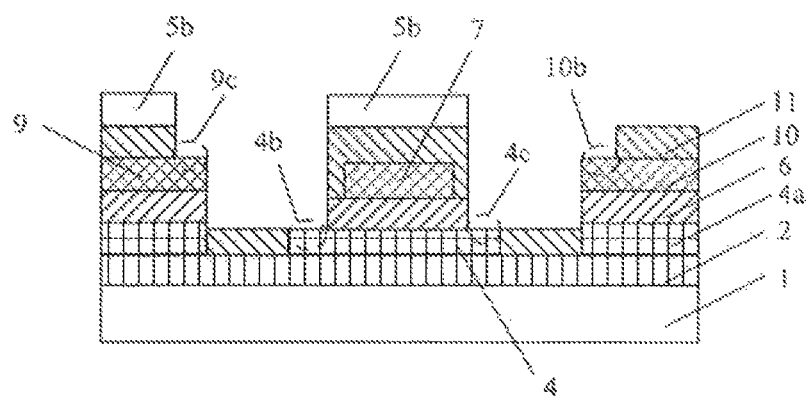
FIG. 5D is a schematic structural view of the array substrate after an ashing process has been employed.
Figure 5E:
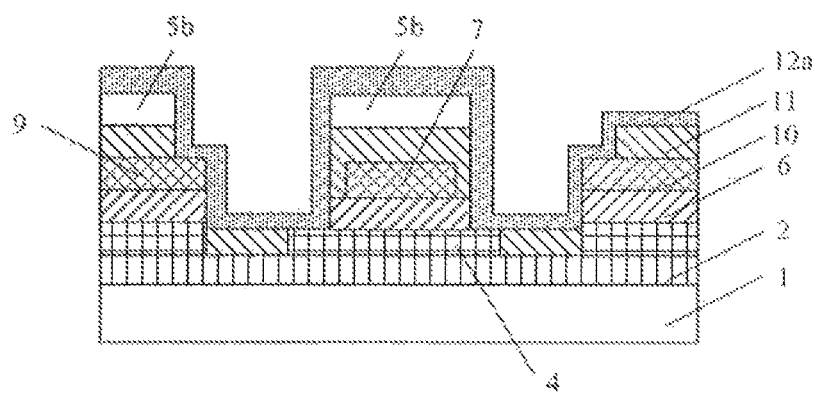
FIG. 5E is a schematic structural view of the array substrate on which a conductive film has been formed.
Figure 5F:
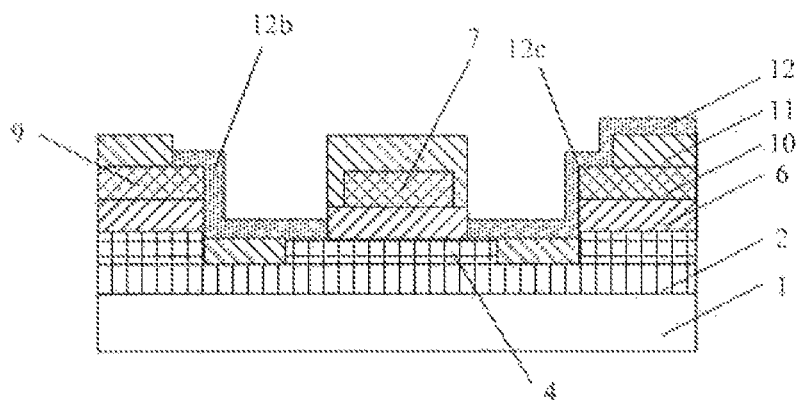
FIG. 5F is a schematic structural view of the array substrate after a third patterning process-lift-off process has been employed.
Figure 5G:
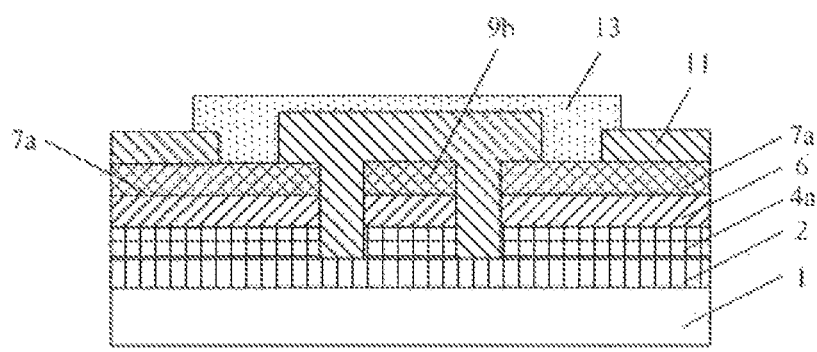
FIG. 5G is a schematic structural view of the array substrate on which a pixel defining layer has been formed.
Figure 5H:
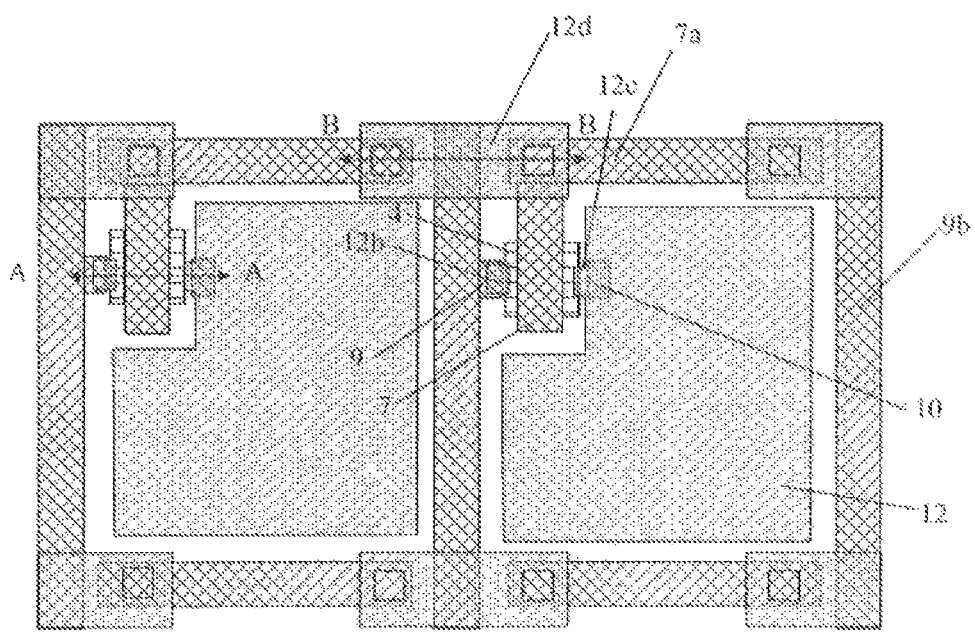
FIG. 5H is a top view corresponding to FIG. 4.

As shown in FIG. 4 and FIG. 5H, the array substrate further comprises a gate line 7a and a data line 9b that are intersected, the gate line 7a and the gate electrode 7 are connected and provided on a same layer, and the data line 9b and the source electrode 9 are connected and provided on a same layer; either the gate line 7a or the data line 9b is disconnected at the intersection position, and is connected by a line connection electrode 12d. The pixel electrode 12, the first connection electrode 12b, the second connection electrode 12c and the line connection electrode 12d are provided on a same layer and formed from a same material.

In the patterning process for forming the gate line 7a and the data line 9b, by using the same metal film 5 as that for forming the gate electrode 7, the source electrode 9 and the drain electrode 10, and by employing a double-tone mask, photoresist with two different thicknesses can be formed on the surface of the metal film 5, that is the photoresist 5a with a larger thickness and the photoresist 5b with a smaller thickness. The metal film 5 corresponding to the photoresist 5a with a larger thickness may simultaneously form the pattern for the gate electrode 7/gate line 7a (the gate line 7a is connected with the gate electrode 7 and can be formed in the step S6) in the first embodiment accordingly, referring to FIG. 5H, and the pattern for the source electrode 9/the data line 9b, the drain electrode 10 (the data line 9b is connected with the source electrode 9 and can be formed in the step S3) in the first embodiment accordingly, referring to FIG. 5H. The photoresist for forming either the pattern for the gate line 7a or the pattern for the data line 9b is segmented (discontinuous) line shape (in the subsequent process, as a example, the gate line 7a is discontinuously provided), to prevent the gate line 7a and the data line 9b from short-circuit due to connection therebetween. By one photolithography process, the gate electrode 7/the gate line 7a, and the source electrode 9/the data line 9b, the drain electrode 10 are formed simultaneously, and then the photoresist with a smaller thickness is removed.

It is to be appreciated that, in order to more clearly illustrate the structure of the layers and the positional relationship between these layers in the array substrate in the present embodiment, the conductive film in the top view of FIG. 5F is provide as having a certain transparency. Meanwhile, since the gate insulation layer 6 and the passivation layer 11 are generally formed from a transparent material (e.g. silicon oxide, silicon nitride, hafnium oxide, silicon oxynitride, or aluminum oxide) and will not affect observation from top view, the gate insulation layer 6 and the passivation layer 11 are not shown in FIG. 5H, so that the relative position relationship among other structures can be more clearly shown.

For example, the pixel electrode 12, the first connection electrode 12b, the second connection electrode 12c and the line connection electrode 12d may be formed from at least one from indium gallium zinc oxide, indium zinc oxide, indium tin oxide, or indium gallium tin oxide.

Accordingly, the present embodiment further provides a manufacturing method for the array substrate, and the manufacturing method comprises the manufacturing method of the thin film transistor as described in the first embodiment.

Based on the manufacturing method of the thin film transistor as described in the first embodiment, the manufacturing method further comprises a step of forming the gate line 7a and the data line 9b that are intersected; the gate line 7a is connected with the gate electrode 7, the data line 9b is connected with the source electrode 9, the gate electrode 7, the source electrode 9, the drain electrode 10, the data line 9b are provided on a same layer as the gate line 7a, and are formed in the same one patterning process, either the gate line 7a or the data line 9b is disconnected at the intersection position and is connected by the line connection electrode 12d.

Furthermore, the manufacturing method further comprises a step of forming the passivation layer 11 and the pixel electrode 12; the passivation layer 11 and the pixel electrode 12 are formed by one patterning process, the passivation layer 11 entirely covers the gate electrode 7, the gate line 7a and the data line 9b from above, and partly covers the source electrode 9 and the drain electrode 10 from above.

The pixel electrode 12 and the line connection electrode 12 for connecting the gate line 7a or the data line 9b are formed above the passivation layer 11, and the pixel electrode 12, the first connection electrode 12b, the second connection electrode 12c and the line connection electrode 12d are simultaneously formed by one patterning process—photoresist lifting-off process.

In brief, the manufacturing method of the array substrate in the present embodiment is to continuously deposit a gate insulation film 6a and a metal film 5 on a substrate 1 on which a poly-silicon film 4a has been formed. By using a double-tone mask photolithography process, photoresist for forming patterns for the poly-silicon active layer 4, the gate electrode 7 and the gate line 7a, the source electrode 9, the drain electrode 10 and the data line 9b are formed on the metal film 5, and by one patterning process, the poly-silicon active layer 4, the gate electrode 7 and the gate line 7a, the source electrode 9 and the data line 9b, the drain electrode 10 are formed on the substrate 1; the gate line 7a are disconnected. A passivation film 11a is formed above the gate electrode 7 and the gate line 7a, the source electrode 9 and the data line 9b, and the drain electrode 10. Photoresist for forming patterns for a passivation layer via hole and the pixel electrode is formed above the passivation film 11a, by using a double-tone mask, by one patterning process and photoresist lifting-off process, the passivation layer 11 and the passivation layer via hole are formed, and patterns comprising the first connection electrode 12b, the second connection electrode 12c and the pixel electrode 12 and patterns for the line connection electrode 12d connecting the disconnected gate line 7b are also formed.

Taking the structure of the thin film transistor as shown in FIG. 2B as an example, based on the thin film transistor formed in the first embodiment, the manufacturing method of the array substrate in the present embodiment will be described with reference to FIG. 5A to FIG. 5H. FIG. 5A to FIG. 5F are sectional views corresponding to the A-A sectional line area in FIG. 5H, and FIG. 5G is a sectional view corresponding to the B-B sectional line area in FIG. 5H.

For example, the step of forming the passivation layer 11 and the pixel electrode 12 in the array substrate in the present embodiment may comprise the following steps.

Step S1): sequentially continuously forming the passivation film and photoresist above the array substrate.

In this step, as shown in FIG. 5A, the array substrate comprising the thin film transistor as shown in FIG. 3F is used as an example (meanwhile further comprising the gate line 7a formed simultaneously with the gate electrode 7 and the data line 9b formed simultaneously with the source electrode 9), a layer of passivation film 11a is formed above the gate electrode 7, the source electrode 9, the drain electrode 10 as well as the gate line 7a and the data line 9b by a PECVD method, the gate insulation film 6a on both sides of the gate electrode 7 corresponds to the area for forming the source contact area 4b and the drain contact area 4c, and at the same time, is covered by the passivation film 11a. Then, a layer of photoresist 5a is formed above the passivation film 11a. The passivation film 11 is generally a SiNx film containing hydrogen and having a thickness of 200 to 500 nm. Then, rapid thermal annealing or heat treatment furnace annealing process is performed, with the SiNx films of the passivation film 11a and the gate insulation film 6a, hydrogenation of the internal portion of the active layer 4 and the interface between the active layer 4 and the $SiO_2$ film is achieved, the volume defects and the interface defects are passivated, and the thin film transistor property of the active layer 4 is improved.

Step S2): exposing and developing the photoresist with a double-tone mask process; in the mask used in the double-tone mask process, an area corresponding to the gate electrode 7 and the gate line 7b connected therewith, the source electrode 9 and the data line 9b connected therewith, the active layer 4, and an area of the source electrode 9 away from the gate electrode is a light shielded area, an area corresponding to the pixel electrode 12 and the line connection electrode 12d for connecting the gate line 7a or the data line 9b is a light partially transmitting area, and the remaining area is a light fully transmitting area. After exposure and development of one time, the thickness of the photoresist in the light shielded area is larger than the thickness of the photoresist in the light partially transmitting area, and the photoresist in the light fully transmitting area is removed.

In this step, as shown in FIG. 5B, by using one double-tone mask, photoresist with two different thicknesses are formed on the surface of the SiNx film of the passivation film 11a, that is, the photoresist with a larger thickness 5a (corresponding to the light shielded area) and the photoresist with a smaller thickness 5b (corresponding to the light partially transmitting area). The double-tone mask may be a half-tone mask or a gray-tone mask, the photoresist with a larger thickness has a thickness ranging from 1 to 3 microns, and covers the gate electrode 7 and the gate line 7a connected therewith, the source electrode 9 and the data line connected therewith, as well as all the area other than the passivation layer via hole and the photoresist with a smaller thickness 5b. The photoresist with a smaller thickness 5b has a thickness ranging from 0.5 to 1.5 microns, and covers the drain electrode 10 and the area for forming the line connection electrode 12d and the pixel electrode 12, and the photoresist in the light fully transmitting area is used to form patterns, such as a data line via hole and a gate line via hole, and so on.

Step S3): etching the passivation film 11a up to a depth at which the metal film of the source electrode 9 adjacent to the gate electrode 7, and the metal film of the drain electrode 9 adjacent to the gate electrode 7 are exposed, to form a mate source contact area 9c and a mate drain contact area 10b, and up to a depth at which the poly-silicon film 4a on both sides of the active layer 4 having a larger width than the gate electrode 7 is exposed, forming a source contact area 4b and a drain contact area 4c.

In this step, as shown in FIG. 5C, the etching process can be performed by employing plasma or inductively coupled plasma method, to form the passivation via hole. Meanwhile, the passivation film 11a is etched until the source electrode 9 of the mate source contact area 9c and the drain electrode 10 of the mate drain contact area 10b are exposed, the passivation film 11a and the gate insulation film 6a are etched until the active layer 4 of the source contact area 4b and the drain contact area 4c is exposed, that is, the source contact area 4b and the drain contact area 4c on the top surface of the active layer 4 are simultaneously formed (exposed) in the etching process of the passivation layer via hole, that is, in this step, a pattern comprising the gate insulation layer 6 is simultaneously formed (corresponding to the step of simultaneously removing the gate insulation film 6a in the area corresponding to the source contact area 4b and the drain contact area 4c on both sides of the gate electrode 7 in the patterning process of the filled insulation film 14 in the first embodiment).

For example, the etching process of the passivation film 11a is performed by employing a inductively coupled plasma method which has high selection ratio and good anisotropy, and the etching process of the passivation layer via hole is achieved by using $SF_6/O_2He$.

In this step, in the passivation layer 11, a gate line via hole for contacting the gate electrode 7 with the gate line 7a, a data line via hole for connecting the source electrode with the data line 9b (both are not shown in FIG. 5C) are formed at the same time. Furthermore, from FIG. 5C, the gate electrode 7 are fully fallen within the coverage of the passivation layer 11, and therefore the gate electrode 7 can be further protected.

Step S4): removing the photoresist in the light partially transmitting area and remaining the photoresist in the light shielded area by an ashing process.

In this step, by using a plasma ashing process, the photoresist with a smaller thickness 5b is removed, and the photoresist 5a originally having a larger thickness is also ashed to a certain thickness, to form the photoresist with a smaller thickness 5b, as shown in FIG. 5D, the photoresist in the area corresponding to the gate electrode 7 and the gate line 7a connected therewith, a part of the source electrode 9 and the data line 9b connected therewith, the active layer 4, and the area of the source electrode 9 far away from the gate electrode 7 is remained, and an area of the array substrate corresponding to the patterns for forming the line connection electrode 12d and the pixel electrode 12 is exposed.

Step S5): forming a conductive film 12a above the array substrate obtained in the step S4).

The conductive film 12a is a transparent metal oxide conductive film, the metal oxide may comprise any one of indium tin oxide (ITO), indium zinc oxide (IZO), or tin aluminum oxide (ZTO), and has a thickness of 20 to 100 nm; alternatively, the conductive film 12a is a stacked film obtained from sub-layers of ITO/Ag (silver)/ITO, IZO/Ag, and the thickness of the indium tin oxide film is from 10 to 50 nm, and the thickness of the Ag film ranges from 20 to 100 nm.

In this step, as shown in FIG. 5E, by magnetic sputtering, a layer of conductive film 12a is deposited on the passivation layer via hole, the residual photoresist with a smaller thickness 5b, the passivation layer 11, the source electrode 9, the drain electrode 10 and the entire substrate surface. The conductive film 12a is used to form the pixel electrode 12, the line connection electrode 12d connecting the disconnected gate line 7a or the data line 9b (in the present embodiment, the gate line 7a), the first connection electrode 12b connecting the mate source contact area 9c and the source contact area 4b, and the second connection electrode 12c connecting the mate drain contact area 10b and the drain contact area 4c.

According to different application of the array substrate, for example, applied in an LCD display device or applied in an OLED device, the conductive film 12a may be formed of different materials. For example, by taking the case that the array substrate is applied in an OLED display device as an example, when the array substrate is applied in a bottom emission AMOLED display device, the conductive film 12a is generally transparent, and may employ oxide transparent conductive film such as indium tin oxide, indium zinc oxide, aluminum tin oxide, and so on, and may have a thickness ranging from 20 to 100 nm. When the array substrate is applied in a top emission AMOLED display device, the conductive film 12a generally employs a composite film such as ITO/Ag/ITO or IZO/Ag, and so on, and the thickness of the ITO film ranges from 10 to 50 nm, and the thickness of the Ag film ranges from 20 to 100 nm.

Step S6): removing the photoresist and the conductive film 12a located on the photoresist a photoresist lifting-off process, to form the pattern comprising the pixel electrode 12 and the line connection electrode 12d for connecting the gate line 7a or the data line 9b, meanwhile to form the pattern comprising the first connection electrode 12b for connecting the source contact area 4c with the mate source contact area 9c, and to form the pattern comprising the second connection electrode 12c for connecting the drain contact area 4c with the mate drain contact area 10b.

In this step, the array substrate on which the conductive film 12a has been deposited is put into a stripping machine stage, the residual photoresist 5b with a smaller thickness as shown in FIG. 5E is removed by using photoresist stripping liquid, and by the photoresist lifting-off process, the conductive film 12a on the photoresist with a smaller thickness 5b is also removed at the same time (the photoresist 5b and the conductive film 12a on the photoresist 5b will be removed at the same time), but the conductive film 12a above the passivation layer via hole (comprising the gate line via hole and the data line via hole) and the passivation layer film in the pixel area is remained, to form the first connection electrode 12b, the second connection electrode 12c and the pixel electrode 12 as shown in FIG. 5F, and to form the line connection electrode 12d for connecting the disconnected gate line 7a as shown in FIG. 5H.

Application of the photoresist lifting-off process facilitates to reduce the times of the mask and photolithography process, and the passivation layer via hole as well as the first connection electrode, the second connection electrode, and the pixel electrode 12 can be respectively formed by two patterning processes. For example, the passivation film of the passivation layer is formed by PECVD, the conductive film is formed by a sputtering process, the patterns for the above passivation film and the conductive film are respectively formed by two photolithography processes, and the passivation film and the conductive film outside of the patterns are removed by a photoresist lifting-off process.

As shown in FIG. 5H, at the same time as performing the above process for forming the passivation layer via hole, the conductive film sputtering and photoresist lifting-off process, at the tap connection position of the disconnected gate line 7a, the line connection electrode 12d for connecting the disconnected gate line 7a is formed, so as to complete the formation of the gate line 7a or the data line 9b in the entire array substrate. The process for forming the passivation layer via hole at the gate line 7a or the data line 9b is performed at the same time as the process for forming the passivation layer via hole at the source electrode and that at the drain electrode, as shown in FIG. 5H, and the deposition and photoresist lifting-off process of the line connection electrode 12d is performed at the same time as the deposition, photoresist lifting-off process of the pixel electrode 12.

By taking the case that the array substrate according to the present embodiment is applied in an OLED display device as an example, as shown in FIG. 5G, the method may further comprise forming a pixel defining layer 13 above the array substrate, the pixel defining layer 13 may be formed from acrylic resin through one patterning process, and the pixel defining layer 13 has a thickness ranging from 1 to 4 micron. Accordingly, above the array substrate on which the above manufacturing process has been completed, by using one patterning process, the preparation of the pixel defining layer 13 as shown in FIG. 4 is completed, and the array substrate is subjected to final annealing treatment by rapid heat annealing or heat treatment furnace, to stabilize the property of the low temperature poly-silicon thin film transistor, and finish the manufacturing of the array substrate according to the present embodiment.

Similar to the manufacturing method of the thin film transistor according to the first embodiment in the manufacturing method of the array substrate according to the present embodiment, in order to reduce the times of the patterning process in the manufacturing process, the passivation layer 11 and the pixel electrode 12 are formed by employing one patterning process and using the technology combing the double-tone photoresist process with photoresist lifting-off process. In the patterning process for forming the passivation layer 11 and the passivation layer via hole, a double-tone mask is used to form photoresist with two different thicknesses, and the thicker photoresist (corresponding to the light shielded area) covers part of the metal film (on which the conductive film on a same layer as the pixel electrode 12 does not exist) of the gate electrode 7/the gate line 7a and the source electrode 9/the data line 9b; and the thinner photoresist (corresponding to the light partially transmitting area) covers part of the metal film comprising the pixel electrode 12 area, forming the patterns for forming the pixel electrode 12 and the line connection electrode 12d. Firstly, the passivation film 11a corresponding to the light fully transmitting area is removed by etching to form the passivation layer via hole (for example, comprising the gate line via hole and the data line via hole), and at the same time, the etching is stopped when the poly-silicon film in the source contact area and the drain contact area is exposed, and is stopped when the metal film in the mate source contact area and the mate drain contact area is exposed. Next, the thinner photoresist in the pixel electrode area is further removed. Then, a layer of transparent conductive film is deposited, and the thicker photoresist and the transparent conductive film thereabove are removed by film photoresist lifting-off process, to form the pixel electrode 12, the first connection electrode 12b for connecting the source electrode 9 with the active layer 4, the second connection electrode 12c for connecting the drain electrode 10 with the active layer 4, and the line connection electrode 12d for connecting the disconnected gate line 7a, by combining the two patterning processes respectively for the passivation layer 11 and the pixel electrode 12 into one, thus the array substrate for applying in an LCD display is completed. Alternatively, furthermore, the pixel defining layer is formed by one further patterning process, to complete the array substrate for applying in an AMOLED display.

In the structure of the array substrate comprising the low temperature poly-silicon thin film transistors according to the present embodiment, the gate electrode 7 (gate line 7a) and the source electrode 9 (data line 9b), the drain electrode 10 are formed by the same one metal film, and there is no interlayer insulation layer therebetween; in this way, it is possible to effectively reduce the parasitic capacitance between the gate electrode 7 as well as the source electrode 9 and the drain electrode 10. With the transparent conductive film same as the pixel electrode 12, the first connection electrode 12b and the second connection electrode 12c contacting with the poly-silicon film of the active layer 4 are formed, and the transparent conductive film is connected with the metal film with low resistance, whereby the impedance of the electrodes and the wires is reduced. The gate line 7a is disconnected at the intersection position with the data line 9b, the line connection electrode 12d formed by the transparent conductive film is used to connect the disconnected gate line 7a, whereby the structure and the manufacturing process of the array substrate is simplified.

The array substrate in the present embodiment is particularly suitable for manufacturing the device structure of the low temperature poly-silicon array substrate (that is, LTPS-AMOLED).

In summary, in the array substrate provided by the embodiments of the present invention, in order to reduce the times of the photolithography in the manufacturing process, the following three technical methods are employed: (1) double-tone mask photolithography process; (2) photoresist lifting-off process; and (3) the gate electrode (the gate line 7a) and the source electrode (the data line 9b), the drain electrode are formed from a same material and deposited on a same layer, and are formed in the same one patterning process, and also the pixel electrode, the first connection electrode, the second connection electrode and the line connection electrode are formed from a same material and deposited on a same layer by the same one patterning process. Thus the times of the patterning process for the array structure comprising the low temperature poly-silicon thin film transistors is remarkably reduced (reduced down to three times), and thus the process complexity is reduced, and the process cost is reduced while the manufacturing process time is shortened, and the process yield is improved.

Third Embodiment

The present embodiment provides a display device comprising the array substrate according to the second embodiment.

According to the structure of the array substrate, the display device may be a liquid crystal display device or an organic light-emitting diode display device. That is to say, the display device may be a liquid crystal display panel, an electronic paper, an OLED panel, a mobile phone, a watch, a tablet computer, a television, a display, a laptop computer, a digital photo frame, a navigator, or any products or components having display function.

This display device is formed by using the low temperature poly-silicon array substrate and has good display effect and lower manufacturing cost.

The thin film transistor and the array substrate comprising the thin film transistor provided by the embodiments of the present invention are both formed by three times of patterning processes, by which the process time period is largely shortened, the process yield is improved, and the process cost is reduced.

The present disclosure has been described above by way of the exemplary embodiment, and the protection scope of the present disclosure would not be limited therein, and is only defined by the following claims.

The present application claims the priority of Chinese Patent Application No. 201410409198.9 filed on Aug. 19, 2014, the Chinese Patent Application is entirely incorporated therein as a part of the present application by reference.

What is claimed is:

1. A thin film transistor comprising a gate electrode, a source electrode, a drain electrode, an active layer and a gate insulation layer,
wherein the gate insulation layer is provided above the active layer, the gate electrode, the source electrode and the drain electrode are provided on a same layer above the gate insulation layer, the active layer and the source electrode are connected through a first connection electrode, and the active layer and the drain electrode are connected through a second connection electrode, wherein, the thin film transistor further comprises:
a poly-silicon film below the source electrode and the drain electrode and located in a same layer with the active layer, and
an insulation film filled in an area between the active layer and the poly-silicon film and within the same layer with the active layer.

2. The thin film transistor according to claim 1, wherein a projection of the gate electrode is at least partly overlapped with a projection of the active layer, and a width of the gate electrode is less than a width of the active layer, and the source electrode and the drain electrode are respectively provided on both sides of the gate electrode and are respectively separated from the gate electrode;
in an area in which the active layer is provided, a width of the gate insulation layer is less than a width of the active layer, so that a source contact area is formed in an area of the active layer adjacent to the source electrode, and a drain contact area is formed in an area of the active layer adjacent to the drain electrode, the first connection electrode is tapped with the source electrode and the source contact area to connect the source electrode with the active layer, the second connection electrode is tapped with the drain electrode and the drain contact area to contact the drain electrode with the active layer.

3. The thin film transistor according to claim 2, wherein the first connection electrode and the second connection electrode are provided on a same layer and are formed of same material.

4. The thin film transistor according to claim 2, wherein the gate electrode, the source electrode and the drain electrode are formed of a same material, the gate electrode, the source electrode and the drain electrode are in a single layer structure formed by any one of molybdenum, molybdenum niobium alloy, aluminum, aluminum neodymium alloy, titanium of copper; or in a stack structure obtained from sub-layers of Mo/Al/Mo or Ti/Al/Ti; the gate electrode, the source electrode and the drain electrode have a thickness ranging from 200 to 500 nm.

5. The thin film transistor according to claim 1, wherein the active layer is formed of a low temperature poly-silicon material.

6. An array substrate comprising the thin film transistor according to claim 1.

7. The array substrate according to claim 6, wherein the array substrate further comprises a passivation layer and a pixel electrode, the passivation layer is partly provided above the drain electrode and forms a mate drain contact area at a side of the drain electrode adjacent to the gate electrode, and the pixel electrode is connected with the drain electrode by tapping with the mate drain contact area and the drain contact area.

8. The array substrate according to claim 7, further comprising a gate line and a data line that are intersected with each other, the gate line is connected with the gate electrode and provided on a same layer as the gate electrode, the data line is connected with the source electrode and is provided on a same layer as the source electrode, and the gate line or the data line is disconnected at the intersection position and is connected through a line connection electrode.

9. The array substrate according to claim 8, wherein the pixel electrode, the first connection electrode, the second connection electrode and the line connection electrode are provided on a same layer, and are formed from a same material.

10. The array substrate according to claim 8, wherein the pixel electrode, the first connection electrode, the second connection electrode and the line connection electrode are formed from any one of indium gallium zinc oxide, indium zinc oxide, indium tin oxide, or indium gallium tin oxide.

11. A display device comprising the array substrate according to claim 6.

12. A manufacturing method of a thin film transistor comprising steps of forming a gate electrode, a source electrode, a drain electrode, an active layer and a gate insulation layer,
wherein the gate insulation layer is formed above the active layer; the gate electrode, the source electrode and the drain electrode are formed on a same layer above the gate insulation layer; the gate electrode, the source electrode and the drain electrode are formed by same one patterning process as the active layer; and a first connection electrode is formed for connecting the active layer with the source electrode, and a second connection electrode is formed for connecting the active layer with the drain electrode,
the manufacturing method of the thin film transistor further comprises:
forming a poly-silicon film below the source electrode and the drain electrode and located in a same layer with the active layer, and
filling an area between the active layer and the poly-silicon film and within the same layer with the active layer with an insulation film.

13. The manufacturing method according to claim 12, wherein, the step of forming the gate electrode, the source electrode, the drain electrode and the active layer comprises:
step S1): sequentially continuously forming a poly-silicon film, a gate insulation film, a metal film and photoresist;
step S2): by using a double-tone mask process, performing exposure and development to the photoresist, wherein in the mask used in the double-tone mask process, an area corresponding to forming of the gate electrode, the source electrode and the drain electrode is a light shielded area, an area corresponding to forming of the active layer having a width larger than the gate electrode is a light partially transmitting area, and a remaining area is a light fully transmitting area; after exposure and development, a thickness of the photoresist corresponding to the area for forming the gate electrode, the source electrode and the drain electrode is larger than a thickness of the photoresist corresponding to the area for forming the active layer having a width larger than the gate electrode, the photoresist in the remaining area is fully removed;
step S3): by an etching process, the metal film unprotected by the photoresist is removed to form a pattern comprising the source electrode and the drain electrode;
step S4): continuously etching the gate insulation film and the poly-silicon film to form a pattern comprising the active layer;
step S5): by an ashing process, removing the photoresist with the smaller thickness to expose the metal film in the area having the width larger than the gate electrode;
step S6): by an etching process, removing the metal film in the area of the active layer having the larger width than the gate electrode, to form a pattern comprising the gate electrode;
step S7): removing all the residual photoresist;

Step S8): using the gate electrode as a barrier layer, ion-doping the pattern for the active layer, and activating ions doped in a channel and source/drain area, to form the active layer.

14. The manufacturing method according to claim 13, wherein in the step S8), the gate electrode is used as the barrier layer, the pattern for the active layer is ion-doped by an ion implantation or ion showering method, and the channel doping and source/drain doping ions are activated by rapid heat annealing process, to form the active layer, and wherein the ion to be doped is from $PH_3/H_2$ or $B_2H_6/H_2$, and the ion implantation dosage is between $10^{15}$-$10^{16}$ ions/cm$^2$, and the implantation energy is between 10-100 Key.

15. The manufacturing method according to claim 13, wherein in the step S1), the metal film is in a single layer structure formed by any one of molybdenum, molybdenum niobium alloy, aluminum, aluminum neodymium alloy, titanium or copper, or in a stack structure obtained from sub-layers of Mo/Al/Mo or Ti/Al/Ti, the metal film is formed by magnetic sputtering, and a thickness of the metal film ranges from 200 to 500 nm;

in the step S6), when the metal film is a stacked structure obtained from sub-layers of Mo/Al/Mo, by using a wet etching method, the metal film in the area of the active layer having a larger width than the gate electrode is removed; when the metal film is a stacked structure obtained from sub-layers of Ti/Al/Ti, by using a dry etching method, the metal film in the area of the active layer having a larger width than the gate electrode is removed.

16. The manufacturing method according to claim 13, further comprising a step of
forming a first connection electrode for connecting the source contact area with the source electrode and a second connection electrode for connecting the drain contact area with the drain electrode by one patterning process.

17. A manufacturing method of an array substrate comprising the manufacturing method of the thin film transistor according to claim 12.

18. The manufacturing method according to claim 17, further comprising a step of forming a gate line and a data line that are intersected with each other,
wherein the gate line is connected with the gate electrode, the data line is connected with the source electrode, the gate electrode, the source electrode, the drain electrode, the data line and the gate line are provided on a same layer and are formed through same one patterning process, the gate line or the data line is disconnected at the intersection position and is connected by a line connection electrode.

19. The manufacturing method according to claim 18, further comprising a step of forming a passivation layer and a pixel electrode,
wherein the passivation layer and the pixel electrode are formed by one patterning process;
the pixel electrode and the line connection electrode for connecting the gate line or the data line are formed above the passivation layer, the pixel electrode, the first connection electrode, the second connection electrode and the line connection electrode are simultaneously formed by one patterning process—photoresist lifting-off process.

20. The manufacturing method according to claim 19, wherein the step of forming the passivation layer and the pixel electrode comprises:
step S1): sequentially forming a passivation film and photoresist above the array substrate;
step S2): by using a double-tone mask process, performing exposure and development to the photoresist, wherein in the mask used in the double-tone mask process, an area corresponding to the gate electrode and the gate line connected therewith, the source electrode and the data line connected therewith, the active layer and an area of the drain electrode away from the gate electrode is a light shielded area; an area corresponding to forming the pixel electrode and the line connection electrode for connecting the gate line or the data line is a light partially transmitting area, and a remaining area is a light fully transmitting area;
step S3): etching the passivation film up to a depth at which the metal film of the source electrode adjacent to the gate electrode, and the metal film of the drain electrode adjacent to the gate electrode are exposed, to form a mate source contact area and a mate drain contact area, and up to a depth at which the poly-silicon film on both sides of the active layer having a larger width than the gate electrode being exposed, to form a source contact area and a drain contact area;
step S4): by an ashing process, removing the photoresist in the light partially transmitting area, and remaining the photoresist in the light shielded area;
step S5): forming a conductive film above the array substrate obtained in the step S4);
step S6): with a photoresist lifting-off process, removing the photoresist and the conductive film on the photoresist, to form the pixel electrode and the line connection electrode for connecting the gate line or the data line, to simultaneously form the patterns for the first connection electrode for connecting the source contact area with the mate source contact area and the second connection electrode for connection the drain contact area with the mate drain contact area.

21. The manufacturing method according to claim 20, wherein in the step S3), the etching of the passivation film is performed by an inductively coupled plasma method having high selection ratio and good anisotropy, and the etching of the light fully transmitting area is achieved by using $SF_6/O_2/He$ gas.

22. The manufacturing method according to claim 20, wherein in the step S5), the conductive film is a transparent metal oxide conductive film and the metal oxide comprises any one of indium tin oxide, indium zinc oxide and tin aluminum oxide, and having a thickness ranging from 20 to 100 nm,
alternatively, the conductive film is a stacked film obtained from sub-layers of indium tin oxide/silver/indium tin oxide or indium zinc oxide/silver, a thickness of the indium tin oxide ranges from 10 to 50 nm, and a thickness of the silver film ranges from 20 to 100 nm.

23. The manufacturing method according to claim 20, further comprising a step of performing a rapid heat annealing or heat treatment furnace annealing process to the array substrate.

* * * * *